United States Patent
Lee et al.

(10) Patent No.: US 9,384,855 B2
(45) Date of Patent: Jul. 5, 2016

(54) SYSTEM-ON-CHIP HAVING SPECIAL FUNCTION REGISTER AND OPERATING METHOD THEREOF

(71) Applicant: SAMSUNG ELECTRONICS CO., LTD., Suwon-si (KR)

(72) Inventors: Dong-Han Lee, Seongnam-si (KR); Eun-Ji Kang, Yongin-si (KR); Jae-Sop Kong, Gwacheon-si (KR); Kee-Moon Chun, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 387 days.

(21) Appl. No.: 14/076,300

(22) Filed: Nov. 11, 2013

(65) Prior Publication Data

US 2014/0164726 A1 Jun. 12, 2014

(30) Foreign Application Priority Data

Dec. 11, 2012 (KR) ........................ 10-2012-0143770

(51) Int. Cl.
| | |
|---|---|
| G06F 1/00 | (2006.01) |
| G11C 29/02 | (2006.01) |
| G11C 11/56 | (2006.01) |
| G06F 3/00 | (2006.01) |

(52) U.S. Cl.
CPC .......... *G11C 29/023* (2013.01); *G11C 11/5642* (2013.01)

(58) Field of Classification Search
CPC ..................................... G06F 1/00; G06F 3/00
USPC ................... 713/600, 500, 400, 322; 710/58; 716/108; 714/744; 327/141
See application file for complete search history.

(56) References Cited

U.S. PATENT DOCUMENTS

| | | | | |
|---|---|---|---|---|
| 4,217,638 | A | * | 8/1980 | Namimoto .............. G06F 9/462 711/200 |
| 5,802,347 | A | | 9/1998 | Yabumoto |
| 5,929,871 | A | * | 7/1999 | Komeichi ................ G06T 1/60 345/531 |
| 6,211,715 | B1 | * | 4/2001 | Terauchi ................... G06F 1/06 327/115 |
| 6,665,802 | B1 | | 12/2003 | Ober |
| 6,691,219 | B2 | | 2/2004 | Ma et al. |
| 6,895,519 | B2 | * | 5/2005 | Endo .......................... G06F 1/32 713/320 |
| 7,065,669 | B2 | | 6/2006 | Cheung et al. |
| 7,222,251 | B2 | | 5/2007 | Ahmad et al. |
| 7,979,611 | B2 | | 7/2011 | Park |
| 8,229,379 | B2 | * | 7/2012 | Zhang .................. H04B 15/005 307/150 |
| 2004/0107388 | A1 | | 6/2004 | Konishi |

(Continued)

FOREIGN PATENT DOCUMENTS

| KR | 1020000046220 A | 7/2000 |
|---|---|---|
| KR | 1020050122973 A | 12/2005 |

(Continued)

*Primary Examiner* — Christopher Shin
(74) *Attorney, Agent, or Firm* — Sughrue Mion, PLLC

(57) ABSTRACT

Exemplary embodiments disclose a system-on-chip (SoC) including a special function register (SFR) and an operating method thereof. The SFR comprises a first update storage element, a second update storage element, a first update logic corresponding to the first update storage element, and a second update logic corresponding to the second update storage element, wherein a clock is supplied to the first update storage element in response to the first update logic being enabled, and the clock is supplied to the second update storage element in response to the second update logic being enabled.

28 Claims, 13 Drawing Sheets

(56) References Cited

U.S. PATENT DOCUMENTS

| | | | |
|---|---|---|---|
| 2005/0094446 A1* | 5/2005 | Terazawa | H03L 7/06 365/200 |
| 2005/0138330 A1 | 6/2005 | Owens et al. | |
| 2005/0156648 A1* | 7/2005 | Yamaguchi | G06F 1/10 327/291 |
| 2007/0070789 A1 | 3/2007 | Park | |
| 2007/0157207 A1 | 7/2007 | Kim et al. | |
| 2009/0144481 A1 | 6/2009 | Julicher et al. | |
| 2010/0332932 A1* | 12/2010 | Muraoka | G01R 31/318364 714/744 |
| 2012/0307581 A1* | 12/2012 | Kodama | G11C 7/222 365/222 |

FOREIGN PATENT DOCUMENTS

| | | |
|---|---|---|
| KR | 1020080002423 A | 1/2008 |
| KR | 1020090114773 A | 11/2009 |

* cited by examiner

SYSTEM-ON-CHIP HAVING SPECIAL FUNCTION REGISTER AND OPERATING METHOD THEREOF

CROSS-REFERENCE TO RELATED APPLICATION

This application claims priority from Korean Patent Application No. 10-2012-0143770 filed on Dec. 11, 2012, in the Korean Intellectual Property Office, the entire disclosure of which is hereby incorporated by reference.

BACKGROUND

1. Field

The present invention relates to a system-on-chip (SoC) having a special function register and an operating method thereof.

2. Description of the Related Art

A special function register (SFR) is a register included in a controller. The SFR may be capable of controlling or monitoring various functions of the controller. For example, the SFR may be used in the controller as an I/O control register, a timer, a stack pointer, a program counter, a return address register, a status register, or a condition code register.

SUMMARY

Exemplary embodiments may provide a system-on-chip (SoC) having a special function register, which can minimize power consumption by gating clocks according to the operating mode and update attribute.

Exemplary embodiments may also provide an operating method of a system-on-chip (SoC) having a special function register, which can minimize power consumption by gating clocks according to the operating mode and update attribute.

Exemplary embodiments will be described in or be apparent from the following description of the preferred embodiments.

According to an aspect of the exemplary embodiments, there is provided a system-on-chip (SoC) including a special function register (SFR), the SFR including a first update storage element, a second update storage element, a first update logic corresponding to the first update storage element, and a second update logic corresponding to the second update storage element, wherein a clock is supplied to the first update storage element in response to the first update logic being enabled, and the clock is supplied to the second update storage element in response to the second update logic being enabled.

According to another aspect of the exemplary embodiments, there is provided a system on chip (SoC) including a special function register (SFR), the SFR including an input port configured to receive a main clock, a first update storage element configured to receive a first clock which is generated from the main clock, and a second update storage element configured to receive a second clock generated from the main clock, wherein in response to one of the first update storage element and the second update storage element being activated, the first clock and the second clock are different from each other.

According to still another aspect of the exemplary embodiments, there is provided an operating method of a system-on-chip (SoC) including a special function register (SFR) including a first update storage element, a second update storage element and an update logic, the operating method including supplying at least one clock to the first update storage element by the update logic in a first status, interrupting supply of the at least one clock to the first update storage element by the update logic in a second status, supplying the at least one clock to the second update storage element by the update logic in the first status, interrupting supply of the at least one clock to the second update storage element by the update logic in the second status.

According to a further aspect of the exemplary embodiments, there is provided a system on chip (SoC) including a special function register (SFR), the SoC including a special function register (SFR), a memory configured to store data, a processor configured to process the data using the SFR, and a bus configured to connect the processor, the memory, and the SFR to each other, wherein the SFR comprises a first update storage element, a second update storage element, a first update logic corresponding to the first update storage element, and a second update logic corresponding to the second update storage element, and in response to the first update logic being enabled, a clock is supplied to the first update storage element, and in response to the second update logic being enabled, the clock is supplied to the second update storage element.

According to another further aspect of the exemplary embodiments, there is provided a method of a special function register (SFR) including supplying a plurality of clocks to respective storage cells in a plurality of respective storage elements during an init time, interrupting the supplying of the plurality of clocks to the respective storage cells after a lapse of the init time, detecting an update signal and entering a snoop status which occurs after the lapse of the init time, enabling a bus update logic corresponding to the update signal and entering a toggle state, supplying a clock to a bus update storage element in the toggle status; and interrupting the clock supply to the bus update storage element and entering the snoop status if another update signal is not detected.

BRIEF DESCRIPTION OF THE DRAWINGS

The above and other features and aspects of the exemplary embodiments will become more apparent by describing in detail preferred embodiments thereof with reference to the attached drawings in which.

DETAILED DESCRIPTION OF THE EXEMPLARY EMBODIMENTS

Figure 1:
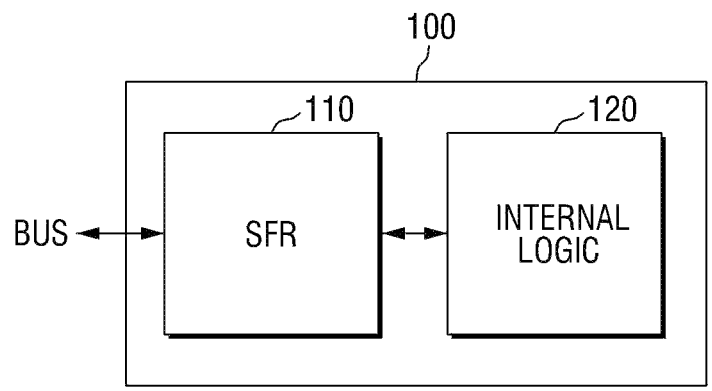
FIG. 1 is a block diagram of an IP device according to an embodiment.

Exemplary embodiments will now be described more fully hereinafter with reference to the accompanying drawings, in which preferred embodiments are shown. The exemplary embodiments may, however, be embodied in different forms and should not be construed as limited to the embodiments set forth herein. Rather, these embodiments are provided so that this disclosure will be thorough and complete, and will fully convey the scope of the exemplary embodiments to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the exemplary embodiments belong. It is noted that the use of any and all examples, or exemplary terms provided herein is intended merely to better illuminate the exemplary embodiments and is not a limitation on the scope of the exemplary embodiments unless otherwise specified. Further, unless defined otherwise, all terms defined in generally used dictionaries may not be overly interpreted.

The exemplary embodiments will be described with reference to perspective views, cross-sectional views, and/or plan views, in which preferred embodiments of the exemplary embodiments are shown. Thus, the profile of an exemplary view may be modified according to manufacturing techniques and/or allowances. In other words, the exemplary embodiments are not intended to limit the scope of the exemplary embodiments but cover all changes and modifications that can be caused due to a change in manufacturing process. Thus, regions shown in the drawings are illustrated in schematic form and the shapes of the regions are presented simply by way of illustration and not as a limitation.

Hereinafter, exemplary embodiments will be described with reference to the accompanying drawings. In the following description, the expression "A clock is supplied or provided" means that clocks are toggled and input, and the expression "A clock is not supplied or provided" means that clocks are not toggled.

Figure 2:
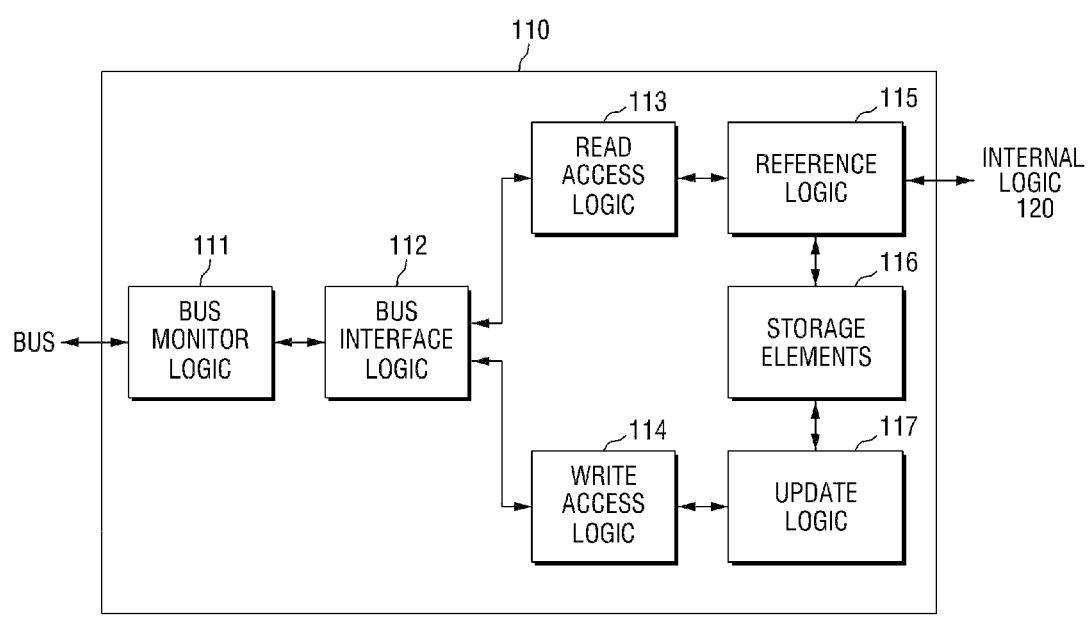
FIG. 2 is a block diagram of a special function register shown in FIG. 1.

FIG. 1 is a block diagram of an IP device according to an embodiment and FIG. 2 is a block diagram of a special function register shown in FIG. 1.

In a related art, the term "Intellectual Property (IP)", which is a design asset employed in the semiconductor architecture and fabrication, is a predetermined function block to be implemented in a semiconductor device, e.g., a System on Chip (SOC). Throughout the specification of the exemplary embodiments, the IP device is defined as a discrete circuit block for performing a special function in the semiconductor device.

Referring to FIG. 1, the IP device 100 according to an embodiment includes a special function register (SFR) 110 and an internal logic 120.

The SFR 110 is configured to store data for performing a special function of the IP device 100.

As an example, the SFR 110 may be used as an I/O control register, a timer, a stack pointer, a program counter, a return address register, a status register, or a condition code register, but aspects of the exemplary embodiments are not limited thereto.

The internal logic 120 is a logic for processing data within the IP device 100, and is configured to process multiple operations using the data stored in the SFR 110.

Referring to FIG. 2, the SFR 110 includes a bus monitor logic 111, a bus interface logic 112, a read access logic 113, a write access logic 114, a reference logic 115, storage elements 116, and an update logic 117.

The read access logic 113 is configured to read the data stored in the storage elements 116. The read access logic 113 processes read accesses through a bus. Further, the read access logic 113 may transmit the data read from the storage elements 116 to the bus interface logic 112.

The write access logic 114 is configured to write data to the storage elements 116. The write access logic 114 processes write accesses through a bus. Further, the write access logic 114 may receive data to be written to the storage elements 116 from the bus interface logic 112.

The bus interface logic 112 is configured to interface between the read access logic 113 and the bus, or between the write access logic 114 and the bus. The bus interface logic 112 may consist of a plurality of logics including a first bus interface logic interfacing between the read access logic 113 and the bus and a second bus interface logic interfacing between the write access logic 114 and the bus.

The bus monitor logic 111 is configured to perform clock gating by detecting an access of the bus, and when the access of the bus is detected, supplying clocks to the read access logic 113, the write access logic 114, or the bus interface logic 112.

When the bus performs a read access to the IP device 100, the bus monitor logic 111 supplies clocks to the bus interface logic 112 and the read access logic 113. When the bus performs a write access to the IP device 100, the bus monitor logic 111 supplies clocks to the bus interface logic 112 and the write access logic 114. When an access is not performed by the bus, a clock is not supplied to the read access logic 113, the write access logic 114, and the bus interface logic 112.

Clocks for monitoring operations may be continuously supplied to the bus monitor logic 111. The bus monitor logic 111 corresponding to the bus interface logic 112 may consist of a plurality of logics. The bus monitor logic 111 may be configured to be specific to bus type.

The storage elements 116 correspond to storage spaces for storing data within the SFR 110. The storage elements 116 include a plurality of storage cells for storing data. As an example, the storage cells may correspond to one or more flip-flops (FFs), but aspects of exemplary embodiments are not limited. The plurality of storage cells may be divided into a plurality of groups according to update attributes, and different types of clock gating may be applied according to the update attributes.

The reference logic 115 is configured to refer to the data stored in the storage elements 116. The reference logic 115 may access all storage cells of the storage elements 116. The reference logic 115 may supply the data stored in the storage elements 116 to the read access logic 113 or the internal logic 120.

The update logic 117 is configured to update the data stored in the storage elements 116. The update logic 117 may perform clock gating on the storage elements 116. The update logic 117 may be divided, and may perform different types of clock gating on the divided storage cells into the plurality of groups. Clocks for performing clock gating may be continuously supplied to the update logic 117.

When the bus performs a read access, a clock is supplied to the read access logic 113 and the bus interface logic 112. Further, when the bus performs a write access, a clock is supplied to the write access logic 114 and the bus interface logic 112. When an access is not performed by the bus, a clock is not supplied to the read access logic 113, the write access logic 114, and the bus interface logic 112.

Although not clearly shown in FIG. 2, each of the bus monitor logic 111 and the update logic 117, which perform clock gating, may include an input port to which the main clock is input and a plurality of clock gating cells. As an example, the main clock may be a clock input from the bus, but aspects of the exemplary embodiments are not limited.

Referring to FIGS. 1 and 2, as an example, the operations performed in the SFR 110 of the IP device 100 may be divided into operations requiring clocks and operations not requiring clocks.

One operation performed by the SFR 110 is a reference operation, in which data to be used to allow the internal logic 120 of the IP device 100 to process multiple operations is supplied. In order to supply the data to be used by the internal logic 120 of the IP device 100, the SFR 110 may immediately supply the data stored in the storage elements 116 to the internal logic 120, or may supply the data after processing the multiple operations using a combinational logic. In this operation, it is not necessary to supply clocks in performing this operation.

In some case, the SFR 110 may supply the data processed by complex sequential logics to the internal logic 120. In this case, it is necessary to supply clocks to perform this operation. In the exemplary embodiment, the sequential logics may not be provided within the SFR 110, but may be configured as one of various components of the internal logic 120. Further, this also applies to a case where data is supplied to the read access logic 113.

Therefore, the reference operation of the SFR 110 may be classified as an operation not requiring clocks.

Another operation performed by the SFR 110 is that a user accesses the SFR 110 through a bus. Through the bus access operation, the bus may read data for the SFR 110. It is necessary to supply clocks to perform the bus access operation. However, the read access operation for the SFR 110 requires only a short time based on the overall operation time of the IP device 100. In other words, the read access for the SFR 110 is not performed during most of the operation time of the IP device 100. This scenario also applies to a write access by the bus.

Another operation performed by the SFR 110 is that data stored in the storage elements 116 of the SFR 110 is updated. The update operation of the SFR 110 is variously performed. In other words, the storage elements 116 may be updated by the user writing data through the bus. Alternatively, the data stored in the storage elements 116 of the SFR 110 may also be updated in frame units in response to a frame sync signal, etc. Alternatively, the data stored in the storage elements 116 of the SFR 110 may also be updated according to a predetermined update signal, such as an interrupt signal. As described above, the SFR 110 may have various update attributes. All of the update operations require clocks.

In the exemplary embodiment, operations performed by the SFR 110 are classified into a plurality of operation modes and separated into blocks (or modules) for the respective operations. According to the operation mode, the SFR 110 may be configured by separate operation units, including a reference operation unit for supplying data to, e.g., the internal logic 120 of the IP device 100, a bus access operation unit for accessing data through a bus, and an update operation unit for updating data stored in the storage elements 116. Different types of clock gating may be applied to the respective operation units.

Since the reference operation unit, e.g., the reference logic 115, consists of output ports of the storage elements 116 and combination logics, a clock is not supplied to the reference operation unit. Only when a bus access is performed, as described above, clocks may be supplied to the bus access operation part, e.g., the read access logic 113, the write access logic 114, or the bus interface logic 112. Only during an update time, clocks may be supplied to the update operation unit, e.g., storage cells in which data stored therein are updated.

Figure 3:
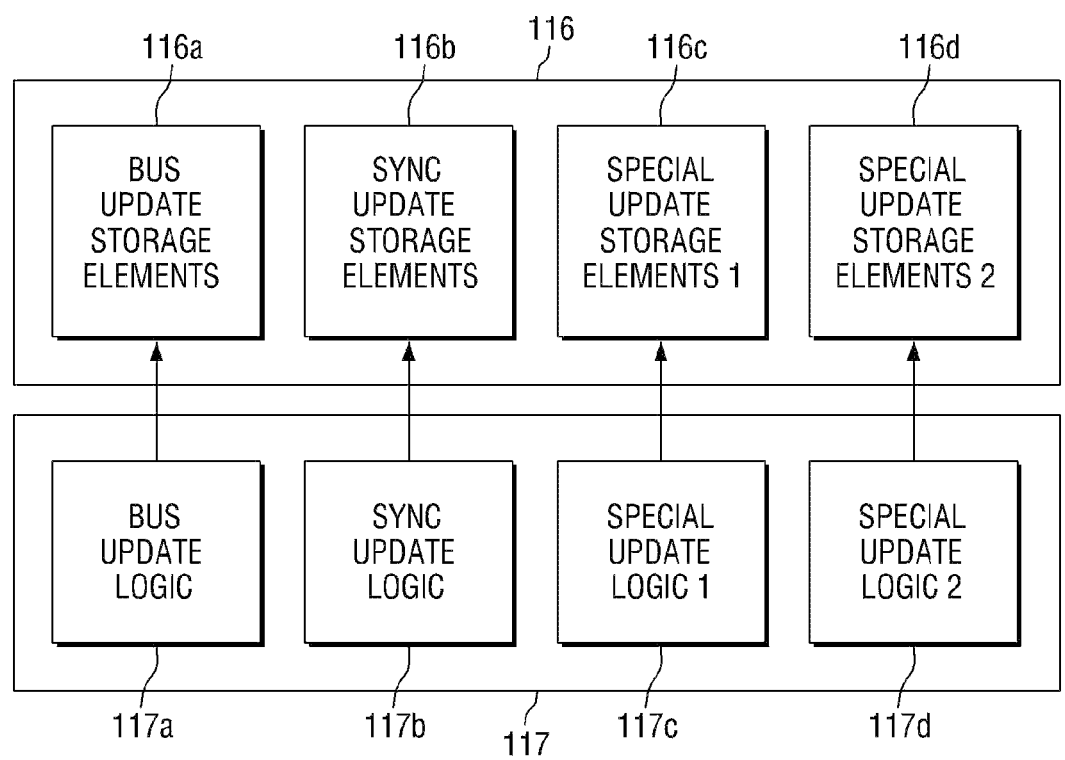
FIG. 3 is a block diagram illustrating operations of storage elements and an update logic shown in FIG. 2.
Figure 4:
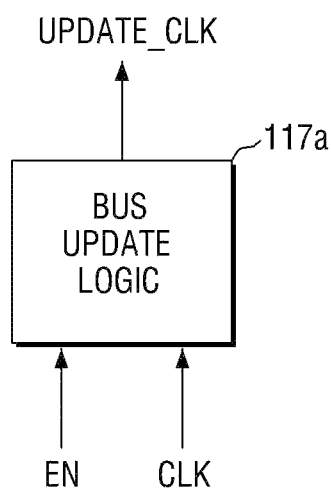
FIG. 4 is a block diagram illustrating operations of a bus update logic shown in FIG. 3.

FIG. 3 is a block diagram illustrating operations of storage elements and an update logic shown in FIG. 2 and FIG. 4 is a block diagram illustrating operations of a bus update logic shown in FIG. 3.

Referring to FIG. 3, the storage elements 116 may be separated into one or more groups according to update attributes. As an example, the storage elements 116 may include a bus update storage element 116a, a sync update storage element 116b, a first special update storage element 116c, and a second special update storage element 116d.

As an example, the update logic 117 may include a bus update logic 117a, a sync update logic 117b, a first special update logic 117c, and a second special update logic 117d, corresponding to the storage elements 116.

The bus update logic 117a may update the data stored in the bus update storage element 116a, and the sync update logic 117b may update the data stored in the sync update storage element 116b. In addition, the first special update logic 117c and the second special update logic 117d may update the data stored in the first special update storage element 116c and the second special update storage element 116d, respectively.

The bus update storage element 116a may be updated according to the write access of the bus, and the sync update storage element 116b may be updated according to a sync signal, e.g., a frame sync signal. In particular, shadow registers of the IP device 100 for multimedia are updated according to the frame sync signal.

In addition, some update storage elements may be updated with intrinsic update conditions according to the interrupt or auto-clear function. The first special update storage element 116c and the second special update storage element 116d may correspond to some of the update storage elements. Some of the update storage elements may have multiple update conditions.

In the embodiment of the exemplary embodiments, as an example, update attributes of the storage elements 116 are divided into four types, and the respective update storage elements 116 may be separately configured, but aspects of the exemplary embodiments are not limited. In the exemplary embodiment, according to the update attributes, different types of clock gating may be applied to the bus update storage element 116a, the sync update storage element 116b, the first special update storage element 116c, and the second special update storage element 116d.

The bus update logic 117a is enabled when a signal indicating an update time by the bus is detected. Only when the bus update logic 117a is enabled, a clock is supplied to the bus update storage element 116a to update the data stored in the bus update storage element 116a. The sync update logic 117b is enabled when a frame sync signal is detected. Only when the sync update logic 117b is enabled, a clock is supplied to the sync update storage element 116b to update the data stored in the sync update storage element 116b.

The first special update logic 117c and the second special update logic 117d are also enabled when a signal for determining the respective update conditions is detected, and a clock is supplied to the first special update storage element 116c and the second special update storage element 116d to update the data stored therein. As described above, the first special update logic 117c and the second special update logic 117d may determine multiple update conditions.

Referring to FIG. 4, a main clock CLK is input to the bus update logic 117a, and an update clock UPDATE_CLK generated from the main clock CLK may be supplied to the bus update storage element 116a.

An enable signal EN based on a write access of a bus may be supplied to the bus update logic 117a. As described above with reference to FIG. 3, the enable signal EN may be a signal indicating an update time of a storage cell. The bus update logic 117a detects the enable signal EN and gates the main clock CLK. In other words, only when the enable signal EN is detected, the bus update logic 117a supplies the update clock UPDATE_CLK to the bus update storage element 116a. Therefore, clock gating cells of the bus update logic 117a may include well known elements, including a latch, an AND gate, an OR gate, etc.

The sync update logic 117b, the first special update logic 117c, and the second special update logic 117d may also operate in substantially the same manner as the bus update logic 117a. Thus, a signal for determining an update condition is also supplied to these update logics 117b, 117c and 117d. Each of the update logics 117b, 117c and 117d gates the main clock CLK, and only when each signal is detected, clocks may be supplied to the respective update storage elements 116b, 116c and 116d.

As described above with reference to FIGS. 3 and 4, the plurality of storage cells of the storage elements 116 may be divided into one or more groups physically separated from each other (e.g., update storage elements). Clock gating is applied to the respective groups through the respective logics for detecting update conditions. Each of the respective logics detects a signal indicating the update condition. Only when the signal is detected, a clock is supplied to the storage cells of a pertinent group. Thus, clocks are minimized from being supplied to all of the storage elements 116.

Therefore, at a first time, a clock is supplied to the bus update storage element 116a, but not supplied to the sync update storage element 116b. At a second time which is different from the first time, clocks may not be supplied to the bus update storage element 116a, but may be supplied to the sync update storage element 116b.

The respective update logics 117 are exclusively enabled from each other for clock gating, but aspects of the exemplary embodiments are not limited.

While the bus update storage element 116a is activated, the update logic 117 supplies the main clock to the bus update storage element 116a, and may interrupt supply of the main clock to the other update storage elements 116b, 116c and 116d.

Accordingly, the clock supplied to the bus update storage element 116a and the clock supplied to the other update storage elements 116b, 116c and 116d may be different from each other. As an example, the clock supplied to the bus update storage element 116a may be a first frequency, and the clock supplied to the other update storage elements 116b, 116c and 116d may be a second frequency. Since the clock supplied to the deactivated update storage elements 116b, 116c and 116d is not toggled, the second frequency becomes closer to infinity while the update storage elements 116b, 116c and 116d are deactivated.

Figure 5:
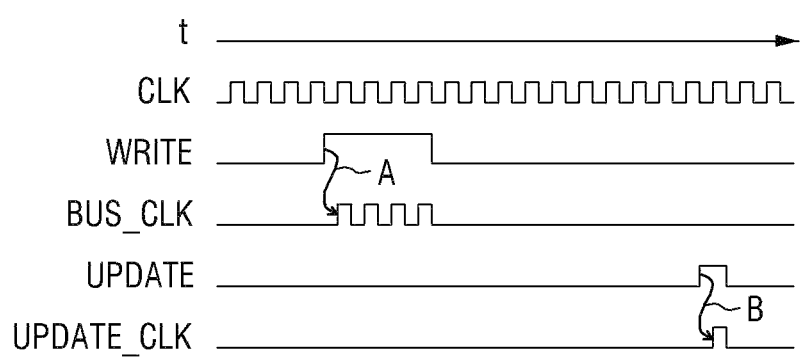
FIG. 5 is a timing diagram illustrating clocks supplied from the special function register shown in FIG. 1.

FIG. 5 is a timing diagram illustrating clocks supplied from the special function register shown in FIG. 1.

Referring to FIG. 5, the main clock CLK is supplied to the SFR 110. The main clock CLK may be a clock supplied from the bus. A write signal WRITE may be a command signal transmitted to the SFR 110 according to the write access of the bus. The bus clock BUS_CLK is a clock supplied to the bus interface logic 112 and the write access logic 114. The update signal UPDATE is a signal indicating an update time. The update clock UPDATE_CLK is a clock supplied to the bus update storage element 116a. The update clock UPDATE_CLK may correspond to the enable signal EN described above in FIG. 4.

The bus monitor logic 111 does not supply clocks to the bus interface logic 112 and the write access logic 114 while performing clock gating. If the write signal WRITE is detected according to the write access of the bus (A of FIG. 5), the bus monitor logic 111 supplies the bus clock BUS_CLK to the bus interface logic 112 and the write access logic 114 while the write signal WRITE is input.

In addition, the bus update logic 117a does not supply the clocks to the bus update storage element 116a while performing clock gating, and does not update the data stored therein. If the update signal UPDATE indicating an update time is detected (B of FIG. 5), the bus update logic 117a supplies the update clock UPDATE_CLK to the bus update storage element 116a while the update signal UPDATE is input.

Figure 6:
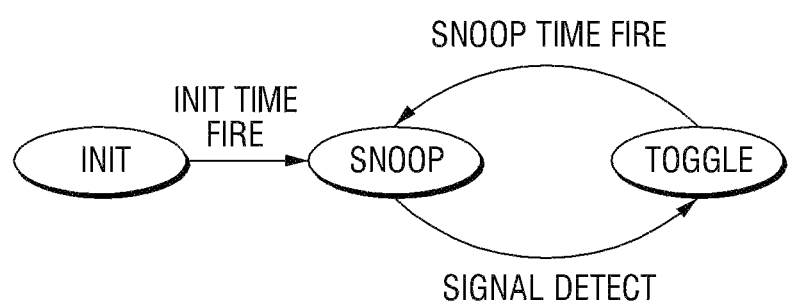
FIG. 6 is a status diagram illustrating statuses in which clocks are gated in the special function register shown in FIG. 1.

FIG. 6 is a status diagram illustrating statuses in which clocks are gated in the special function register shown in FIG. 1.

Referring to FIG. 6, the SFR 110 may have various statuses, including an init status, a snoop status, and a toggle status.

When the SFR 110 is reset, clocks may be supplied to all blocks until all of the storage cells and logics are stabilized. The bus monitor logic 111 supplies clocks to the bus interface logic 112, the read access logic 113 and the write access logic 114. The update logic 117 supplies clocks to all of the storage cells of the storage elements 116. After the lapse of an init time (e.g., init time fire), the SFR 110 transitions to a snoop status.

In the snoop status, the logics of SFR 110 perform clock gating monitoring of their respective condition signals. As described above, the bus monitor logic 111 monitors a read access or a write access, and the update logic 117 monitors a signal indicating an update time. Thereafter, if a condition signal is detected, the SFR 110 transitions to a toggle status to supply clocks.

In the toggle status, the SFR 110 supplies a clock to a clock requiring block to perform normal operations. If no further condition signal is detected even after the lapse of a predetermined snoop time (snoop time fire), the SFR 110 transitions to a snoop status. In the snoop status, the logics of SFR 110 again perform clock gating monitoring of their respective condition signals.

The operating method of the SFR shown in FIG. 1 will be now described

Figure 7:
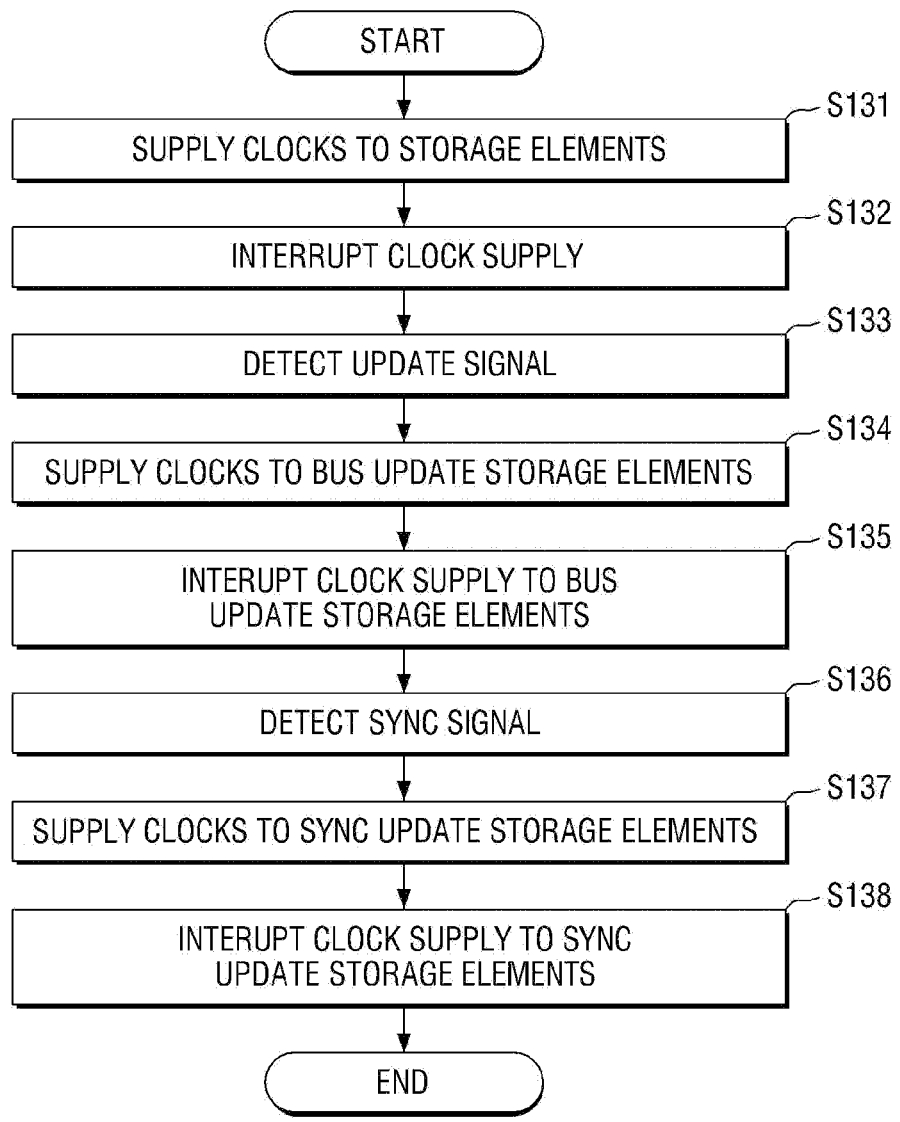
FIG. 7 is a flowchart illustrating an operating method of the special function register shown in FIG. 1.

FIG. 7 is a flowchart illustrating an operating method of the special function register shown in FIG. 1. For the sake of convenience, the following description will focus on differences between the present and previous embodiments.

Referring to FIG. 7, in an init status, the update logic 117 supplies clocks to all of the storage cells of the storage elements 116 (S131). After the lapse of init time, the update logic 117 interrupts clock supply to all of the storage cells of the storage elements 116 (S132).

Next, in a snoop status, the update logic 117 detects an update signal UPDATE (S133). The bus update logic 117a is enabled corresponding to the update signal UPDATE. In a toggle status, the bus update logic 117a supplies a clock to the bus update storage element 116a (S134).

If no further update signal is detected even after the lapse of a predetermined snoop time, the update logic 117 transitions to the snoop status while interrupting clock supply to the bus update storage element (S135).

Next, in the snoop status, the update logic 117 detects a sync signal SYNC (S136). The sync update logic 117b is enabled in response to the sync signal SYNC, and supplies a clock to the sync update storage element 116b in a toggle status (S137).

Next, if no further sync signal is detected even after the lapse of a snoop time, the update logic 117 transitions to the snoop status while interrupting clock supply to the sync update storage element 116b (S138).

Figure 8:
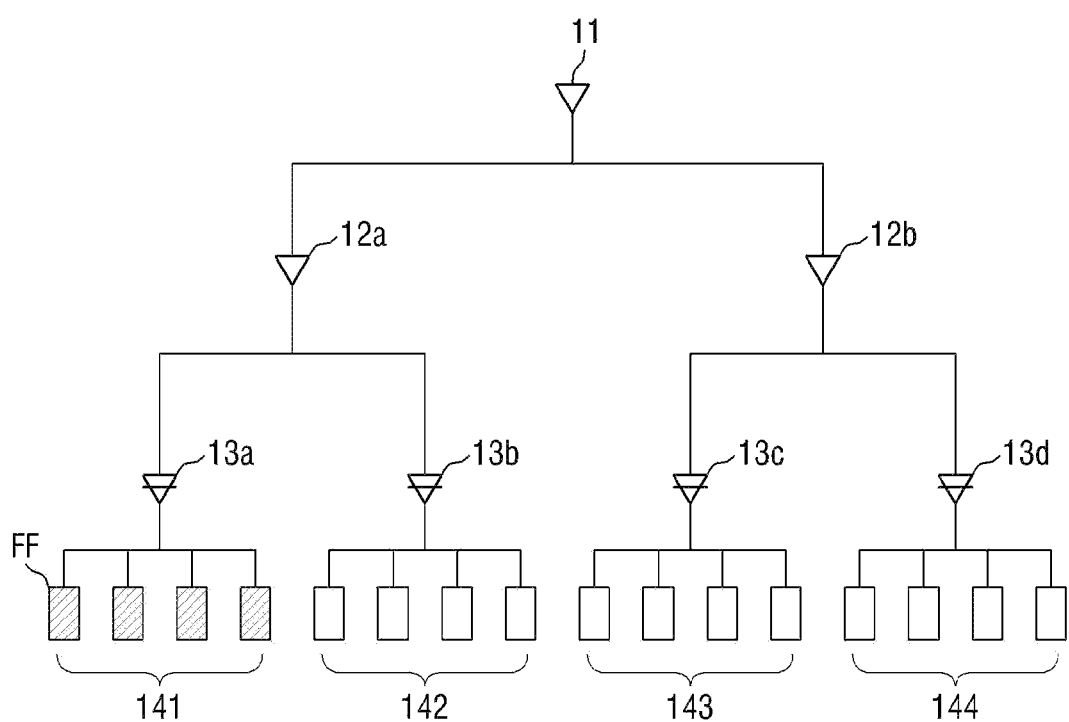
FIG. 8 is a diagram illustrating a clock tree of the special function register shown in FIG. 1.

Hereinafter, a clock tree of the SFR shown in FIG. 1 will be described. FIG. 8 is a diagram illustrating a clock tree of the special function register shown in FIG. 1. For the sake of convenience, repeated description will be omitted.

The clock tree includes a clock source 11, clock buffers 12a and 12b, clock gating cells 13a to 13d, and loads. The clock source 11 supplies clocks. The clock buffers 12a and 12b buffer the clocks supplied from the clock source 11 and supplies the buffered clocks to the loads. The clock gating cells 13a to 13d may supply clocks or may interrupt clock supply according to conditions. The loads may correspond to the plurality of flip-flops FFs of the storage elements 116.

The plurality of flip-flops FFs may consist of a plurality of groups being selectively supplied with clocks. As an example, the plurality of flip-flops FFs may be separately configured by a first update group 141, a second update group 142, a third update group 143, and a fourth update group 144. The first to fourth update groups 141 to 144 may correspond to the update storage elements 116a, 116b, 116c and 116d shown in FIG. 3.

A plurality of clock gating cells 13a to 13d may be formed at nodes between each of the update groups 141 to 144 and each of the clock buffers 12a and 12b. The plurality of clock gating cells 13a to 13d may be included as some elements of the update logic 117 shown in FIG. 3. The update logic 117 may selectively supply clocks to the first to fourth update groups 141 to 144 using the plurality of clock gating cells 13a to 13d. For example, FIG. 8 illustrates that clocks are supplied only to the first update group 141.

Figure 9:
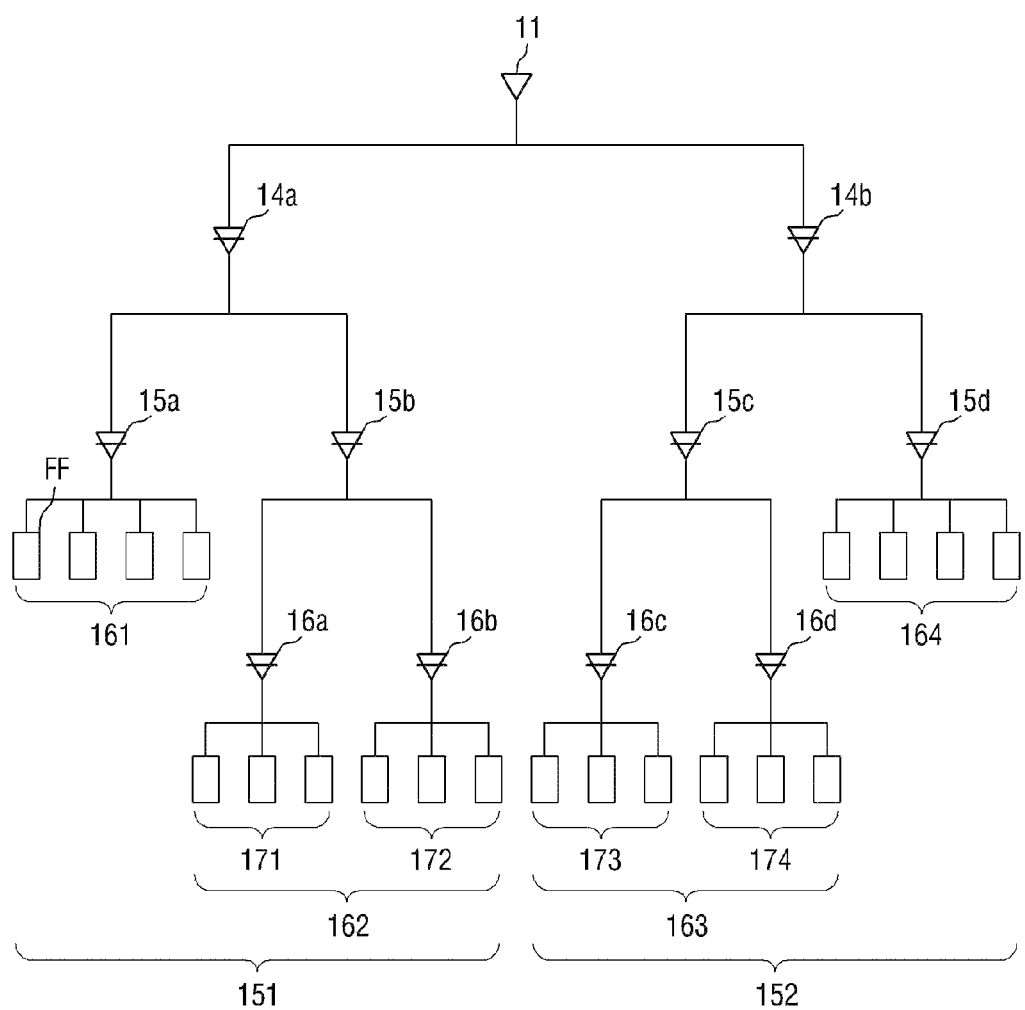
FIG. 9 is a diagram illustrating an application example of the clock tree shown in FIG. 8.

FIG. 9 is a diagram illustrating an application example of the clock tree shown in FIG. 8. For the sake of convenience, the following description will focus on differences between the application examples shown in FIGS. 8 and 9.

Referring to FIG. 9, a plurality of flip-flops FFs may consist of hierarchical groups. As an example, the plurality of flip-flops FFs may be separately configured by a first update group 151 and a second update group 152.

The flip-flops FFs included in the first update group 151 may be divided into a first sub group 161 and a second sub group 162. Similarly, the flip-flops FFs included in the second update group 152 may be divided into a third sub group 163 and a fourth sub group 164. Some sub groups 163 and 164 are also hierarchized and divided into first to fourth parts 171 to 174.

A plurality of clock gating cells 14a, 14b, 15a to 15d, and 16a to 16d may be formed at nodes of the clock tree. The plurality of clock gating cells 14a, 14b, 15a to 15d, and 16a to 16d may be included in some elements of the update logic 117 shown in FIG. 3. The update logic 117 may selectively supply clocks in update group, sub group or part units using the plurality of clock gating cells 14a, 14b, 15a to 15d, and 16a to 16d.

As an another example, the IP device 100 according to the exemplary embodiment can be applicable to one of various electronic devices, such as a computer, a portable computer, an Ultra Mobile PC (UMPC), a workstation, a net-book, a personal digital assistant (PDA), a web tablet, a wireless phone, a mobile phone, a smart phone, an e-book, a portable multimedia player (PMP), a portable game console, a navigation device, a black box, a digital camera, a 3-dimensional television, a digital audio recorder, a digital picture player, a digital video recorder, a digital video player, a wireless transmitter-receiver, a home network device, a computer network, a telematix network, a RFID device or one of various elements comprising a computing system.

Meanwhile, as an example, the special function register (SFR) 110, the internal logic 120, or the IP device 100 may be mounted in various packages, such as PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 10:
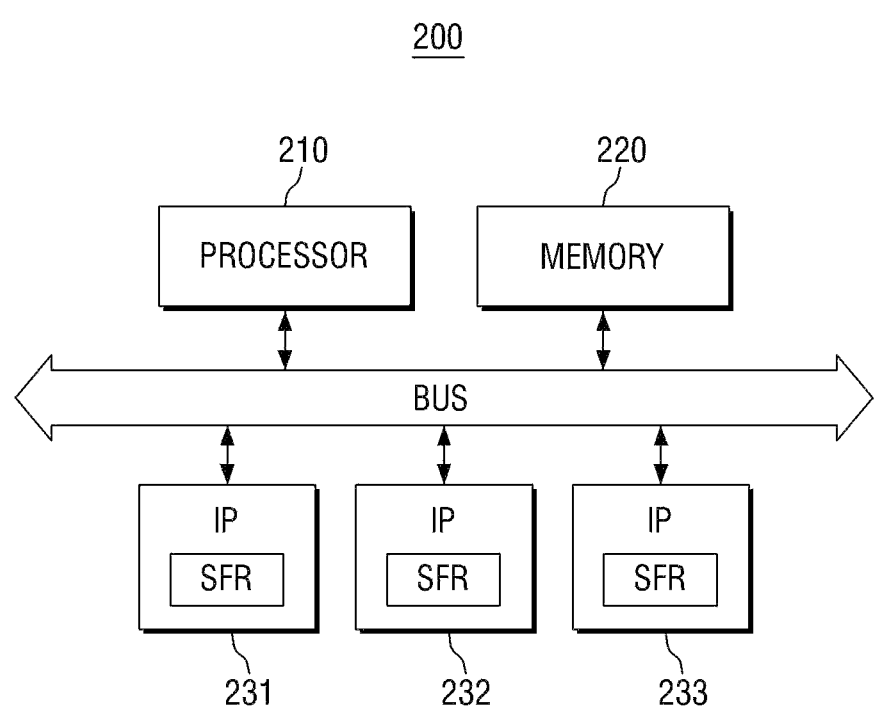
FIG. 10 is a block diagram illustrating an electronic system including the special function register shown in FIG. 1.

FIG. 10 is a block diagram illustrating an electronic system including the special function register shown in FIG. 1.

Referring to FIG. 10, the electronic system 200 may include a processor 210, a memory 220, and a plurality of IP devices (IPs) 231 to 233. The processor 210, the memory 220, and the plurality of IP devices 231 to 233 may be connected to each other through a bus. The bus may be a path through which data moves. The electronic system 200 may be configured by a system in which discrete semiconductors, such as the processor 210, the memory 220, or the plurality of IP devices 231 to 233 perform various functions, are provided as a semiconductor device of a system on chip (SoC).

The processor 210 may include at least one of a microprocessor, a digital signal processor, or logic elements performing functions similar to those of these processors.

The memory 220 is a storage device that stores data and/or commands. Although not clearly shown, the electronic system 200 may further include an operating memory for improving the operation of the processor 210, such as high-speed DRAM and/or SRAM.

The IP devices 231 to 233 may be circuit blocks performing particular functions in the electronic system 200. Each of the IP devices 231 to 233 may include a special function register (SFR). The processor 210 may process data using the SFR. Each of the IP devices 231 to 233 may correspond to the IP device 100 shown in FIG. 1.

Figure 11:
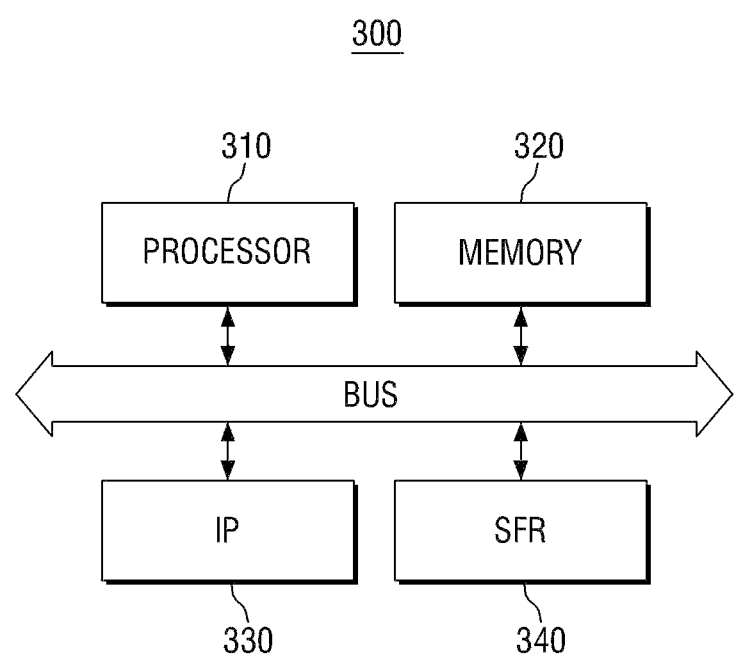
FIG. 11 is a diagram illustrating an application example of the electronic system shown in FIG. 10.

FIG. 11 is a diagram illustrating an application example of the electronic system shown in FIG. 10. For the sake of convenience, the following description will focus on differences between the application examples shown in FIGS. 10 and 11.

Referring to FIG. 11, the electronic system 300 may include a processor 310, a memory 320, an IP device (IP) 330, and special function register (SFR) 340. The processor 310, the memory 320, the IP device 330, and the SFR 340 may be connected to each other through a bus.

The SFR 340 may not be incorporated into the IP device 330, but may be provided as a separate block to be connected to the bus. The processor 310 may process data using the SFR 340. The IP device 330 (e.g., an internal logic of IP) may access the SFR 340 through the bus, or may be connected to a separate output port of the SFR 340 to receive data.

Figure 12:
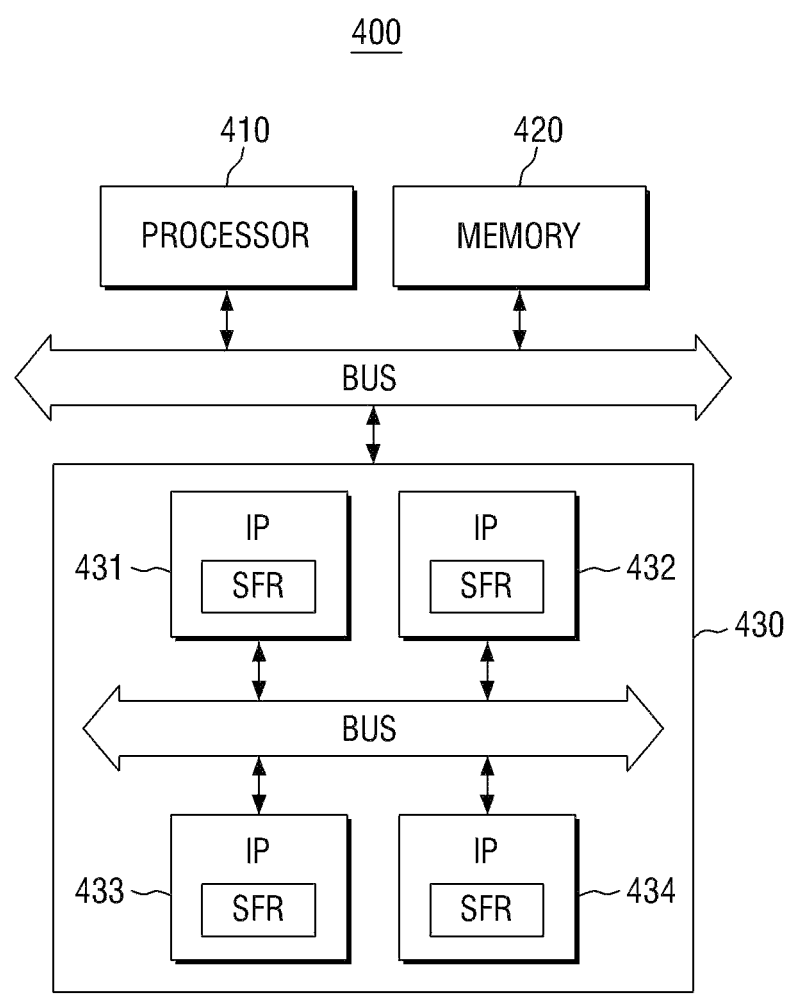
FIG. 12 is a block diagram illustrating another application example of the electronic system including the special function register shown in FIG. 1.

FIG. 12 is a block diagram illustrating another application example of the electronic system including the special function register shown in FIG. 1. For the sake of convenience, the following description will focus on differences between the electronic systems shown in FIGS. 10 and 12.

Referring to FIG. 12, the electronic system 400 may include a processor 410, a memory 420, and an IP block 430. The processor 410, the memory 420, and the IP block 430 may be connected to each other through a bus.

The IP block 430 may be configured by a circuit block including hierarchical IP devices 431 to 434. Each of the IP devices 431 to 434 may include or may not include a special function register (SFR).

Figure 13:
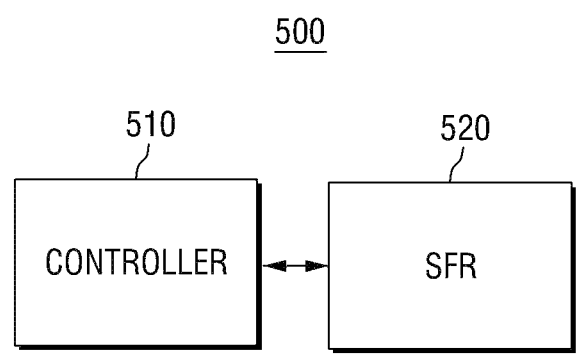
FIG. 13 is a block diagram illustrating still another application example of the electronic system including the special function register shown in FIG. 1.

FIG. 13 is a block diagram illustrating still another application example of the electronic system including the special function register shown in FIG. 1.

Referring to FIG. 13, the electronic system 500 includes a controller 510 and a special function register (SFR) 520. The controller 510 may be a semiconductor device, such as a System on Chip (SoC) including a processor and a memory. The SFR 520 may not be incorporated into the controller 510, but may be provided as a separate block to be connected to the controller 510.

In addition to the SFR 520 connected to the controller 510, an additional SFR may be further provided within the controller 510. The controller 510 may process data using the SFR 520.

The steps of the method or algorithm described in connection with the aspects disclosed herein may be embodied directly in hardware, in a software module executed by a processor, or in a combination of hardware and software. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an application specific integrated circuit (ASIC). Additionally, the ASIC may reside in a user terminal. Alternatively, the processor and the storage medium may reside as discrete components in a user terminal.

In concluding the detailed description, those skilled in the art will appreciate that many variations and modifications can be made to the preferred embodiments without substantially departing from the principles of the exemplary embodiments. Therefore, the disclosed preferred embodiments of the exemplary embodiments are used in a generic and descriptive sense only, and not for purposes of limitation.

What is claimed is:

1. A system on chip (SoC) including a special function register (SFR), wherein the SFR comprising:
a first update storage element;
a second update storage element;
a first update logic corresponding to the first update storage element; and
a second update logic corresponding to the second update storage element,
wherein a clock is supplied to the first update storage element in response to the first update logic being enabled, and the clock is supplied to the second update storage element in response to the second update logic being enabled.

2. The SoC of claim 1, wherein at a first time, the clock is supplied to the first update storage element and not supplied to the second update storage element, and at a second time which is different from the first time, the clock is not supplied to the first update storage element and supplied to the second update storage element.

3. The SoC of claim 2, wherein the first update logic and the second update logic are enabled using different enable signals.

4. The SoC of claim 1, wherein the first update logic supplies at least one clock to the first update storage element corresponding to a first signal, and the second update logic supplies the at least one clock to the second update storage element corresponding to a second signal.

5. The SoC of claim 4, wherein the first update logic updates data stored in the first update storage element according to the first signal, and the second update logic updates data stored in the second update storage element according to the second signal.

6. The SoC of claim 1, wherein the SFR further comprises:
a read access logic configured to transmit data read from the first update storage element and the second update storage element;
a write access logic configured to receive data to be written to the first update storage element and the second update storage element; and
a bus interface logic configured to interface between the read access logic and a bus or the write access logic and the bus.

7. The SoC of claim 6, wherein in response to the bus performing a read access, the clock is supplied to the read access logic and the bus interface logic,
in response to the bus performing a write access, the clock is supplied to the write access logic and the bus interface logic, and in response to an access not performed by the bus, the clock is not supplied to the read access logic, the write access logic, and the bus interface logic.

8. The SoC of claim 7, wherein the SFR further comprises:
a bus monitor logic configured to detect an access, and
in response to the access of the bus being detected, supplying at least one clock to the bus interface logic and the read access logic or the write access logic.

9. The SoC of claim 1, wherein the SFR further comprises:
a reference logic configured to transmit the data stored in the first update storage element and the second storage element to an internal logic,
wherein the clock is not supplied to the reference logic.

10. The SoC of claim 1, wherein each of the first update storage element and the second update storage element include at least one flip-flop.

11. A system on chip (SoC) including a special function register (SFR), the SFR comprising:
an input port configured to receive a main clock;
a first update storage element configured to receive a first clock which is generated from the main clock; and
a second update storage element configured to receive a second clock generated from the main clock,
wherein in response to one of the first update storage element and the second update storage element being activated, the first clock and the second clock are different from each other.

12. The SoC of claim 11, wherein in response to one of the first update storage element and the second update storage element being activated, the first clock is at a first frequency, and the second clock is at a second frequency which is different from the first frequency.

13. The SoC of claim 11, wherein the SFR further comprises: an update logic configured to supply at least one clock to the first update storage element and the second update storage element by gating the main clock.

14. The SoC of claim 13, wherein in response to one of the first update storage element and the second update storage element being activated, the update logic supplies the main clock to the activated update storage element of the one of the first update storage element and the second update storage element and interrupts supply of the main clock to the deactivated update storage element which is not the one of the first update storage element and the second update storage element.

15. An operating method of a system on chip (SoC) including a special function register (SFR) comprising a first update storage element, a second update storage element, and an update logic, the operating method comprising:
supplying at least one clock to the first update storage element by the update logic in a first status;
interrupting supply of the at least one clock to the first update storage element by the update logic in a second status;
supplying the at least one clock to the second update storage element by the update logic in the first status; and
interrupting supply of the at least one clock to the second update storage element by the update logic in the second status.

16. The method of claim 15, further comprising:
enabling the update logic corresponding to a first signal before the update logic supplies the at least one clock to the first update storage element; and
enabling the update logic corresponding to a second signal before the update logic supplies the at least one clock to the second update storage element.

17. The method of claim 15, further comprising:
supplying the at least one clock to the first update storage element and the second update storage element in a third status.

18. The method of claim 17, wherein the update logic supplies the at least one clock for a reference time in the third status.

19. A system on chip (SoC) including a special function register (SFR), the SoC comprising:
a special function register (SFR);
a memory configured to store data;
a processor configured to process the data using the SFR; and
a bus configured to connect the processor, the memory, and the SFR to each other,
wherein the SFR comprises a first update storage element, a second update storage element, a first update logic corresponding to the first update storage element, and a second update logic corresponding to the second update storage element, and in response to the first update logic being enabled, a clock is supplied to the first update storage element, and in response to the second update logic being enabled, the clock is supplied to the second update storage element.

20. The SoC of claim 19, wherein at a first time, the clock is supplied to the first update storage element and not supplied to the second update storage element, and at a second time which is different from the first time, the clock is not supplied to the first update storage element and supplied to the second update storage element.

21. The SoC of claim 19, wherein the first update logic supplies at least one clock to the first update storage element corresponding to a first signal, and the second update logic supplies the at least one clock to the second update storage element corresponding to a second signal.

22. The SoC of claim 19, wherein the SFR further comprises:
a read access logic configured to transmit data read from the update storage elements, a write access logic configured to receive data to be written to the update storage elements, and a bus interface logic configured to interface between the read access logic and a bus or the write access logic and the bus.

23. The SoC of claim 22, wherein in response to the bus performing a read access, the clock is supplied to the read access logic and the bus interface logic, in response to the bus performing a write access, the clock is supplied to the write access logic and the bus interface logic, and in response to an access not performed by the bus, the clock is not supplied to the read access logic, the write access logic, and the bus interface logic.

24. The SoC of claim 23, wherein the SFR further comprises:
a bus monitor logic configured to detect the access of the bus, and in response to the access of the bus being detected, supplying the at least one clock to the bus interface logic and the read access logic or the write access logic.

25. The SoC of claim 19, wherein the SFR further comprises:
a reference logic configured to transmit the data stored in the first update storage element and the second update storage element to an internal logic,
wherein the clock is not supplied to the reference logic.

26. An operating method of a special function register (SFR), the method comprising:

supplying a plurality of clocks to respective storage cells in a plurality of respective storage elements during an init time;

interrupting the supplying of the plurality of clocks to the respective storage cells after a lapse of the init time;

detecting an update signal and entering a snoop status which occurs after the lapse of the init time;

enabling a bus update logic corresponding to the update signal and entering a toggle state;

supplying a clock to a bus update storage element in the toggle status; and interrupting the clock supply to the bus update storage element and entering the snoop status if another update signal is not detected.

27. The method of claim 26, further comprising:

detecting a sync signal in the snoop status;

enabling a sync update logic in response to the sync signal and entering the toggle status; and supplying the clock to the sync update storage element in the toggle status.

28. The method of claim 27, further comprising:

interrupting the supply of the clock to the sync update storage element if another sync signal is not detected after a lapse of a snoop time in the snoop status.

* * * * *